United States Patent [19]

Uede et al.

[11] 4,247,855

[45] Jan. 27, 1981

[54] SEGMENTED BARGRAPH DISPLAY BY AN ELECTROCHROMIC DISPLAY DEVICE

[75] Inventors: Hisashi Uede, Yamatokoriyama; Hiroshi Take, Tenri; Katubumi Koyanagi, Tenri; Yasuhiko Inami, Tenri, all of Japan

[73] Assignee: Sharp Kabushiki Kaisha, Osaka, Japan

[21] Appl. No.: 928,917

[22] Filed: Jul. 28, 1978

[30] Foreign Application Priority Data

Jul. 29, 1977 [JP] Japan .................................. 52-92414
Oct. 19, 1977 [JP] Japan ................................ 52-126159
Nov. 4, 1977 [JP] Japan ................................ 52-132953

[51] Int. Cl.³ .............................................. G06F 3/14
[52] U.S. Cl. ........................................ 340/753; 340/763; 340/785
[58] Field of Search ............... 340/753, 754, 763, 785; 350/357

[56] References Cited

U.S. PATENT DOCUMENTS

| | | | |
|---|---|---|---|
| 3,772,874 | 11/1973 | Lefkowitz | 340/753 |
| 3,908,355 | 9/1975 | Wiesner | 340/753 |
| 4,057,739 | 11/1977 | Otake | 340/785 |
| 4,060,975 | 12/1977 | Yamaguchi | 340/785 |

Primary Examiner—Marshall M. Curtis
Attorney, Agent, or Firm—Birch, Stewart, Kolasch & Birch

[57] ABSTRACT

A plurality of segment electrodes are aligned in an electrochromic display device for displaying an analog value in a bargraph fashion. When the analog value to be displayed increases, a coloration drive signal is applied only to the segment electrode which should be changed from the bleached state to the coloration state. Contrarily, when the analog value to be displayed decreases, a bleaching drive signal is applied only to the segment electrode which should be changed from the coloration state to the bleached state. Remaining segment electrodes do not receive any drive signals in transition of the displayed value.

13 Claims, 23 Drawing Figures

SEGMENTED BARGRAPH DISPLAY BY AN ELECTROCHROMIC DISPLAY DEVICE

BACKGROUND AND SUMMARY OF THE INVENTION

The present invention relates to an electrochromic display device for displaying an analog value in a bargraph fashion.

The present invention relates, more particularly, to a driver circuit for an electrochromic display device which includes a plurality of aligned segments for displaying an analog value in a bargraph fashion.

It is well known that a coloration condition is memoried in an electrochromic display device for several hours through several days without applying any voltage signals to the electrochromic display device. In addition, the coloration operation and the bleaching operation are controllable by selecting the direction of electric current flowing through a display electrode included in the electrochromic display device.

The present invention is to utilize the above-mentioned features to provide an electrochromic display device for displaying an analog value in a bargraph fashion.

Accordingly, an object of the present invention is to provide a segmented bargraph display for displaying an analog value through the use of an electrochromic display device.

Another object of the present invention is to provide a driver circuit for an electrochromic display device which displays an analog value in a bargraph fashion.

Still another object of the present invention is to enhance the visibility of a segmented electrochromic bargraph display device.

Other objects and further scope of applicability of the present invention will become apparent from the detailed description given hereinafter. It should be understood, however, that the detailed description and sepcific examples, while indicaing preferred embodiments of the invention, are given by way of illustration only, since various changes and modifications within the spirit and scope of the invention will become apparent to those skilled in the art from this detailed description.

To achieve the above objects, pursuant to an embodiment of the present invention, segment electrodes are aligned in an electrochromic display device for displaying an analog value in a bargraph fashion. When the displayed information is desired to be changed, a comparing circuit develops a control signal which indicates whether the displayed information should be increased or decreased, that is, a specific segment electrode should be colored or bleached. Remaining segment electrodes do not receive any drive signals.

In a preferred form, a driver circuit develops a regeneration signal in a predetermined interval of time to regenerate the display condition of the electrochromic display device.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
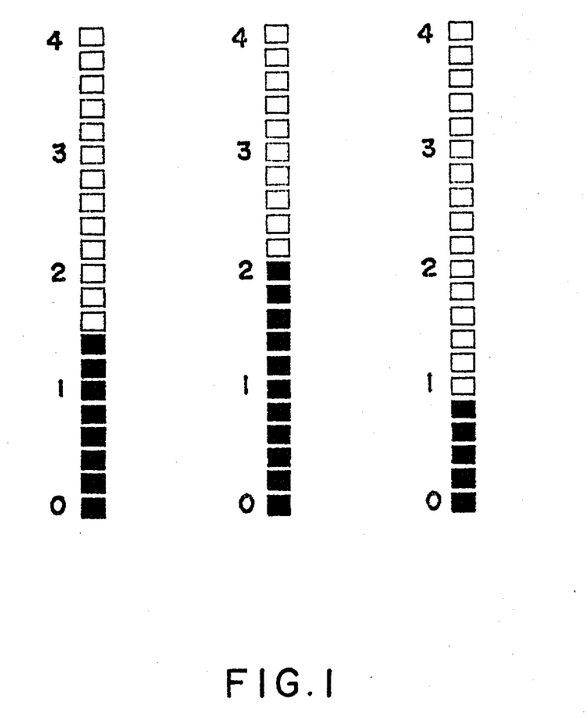
FIG. 1 is a schematic view of an example of a bargraph display conducted by an embodiment of an electrochromic display device of the present invention.

FIG. 1 schematically shows an example of a bargraph display conducted by an embodiment of an electrochromic display device of the present invention.

The electrochromic display device includes a plurality of aligned segment electrodes for displaying an analog value. In the drawing, the segment electrodes colored black represent the segment electrodes placed in the coloration state, whereas white segment electrodes represent the segment electrodes placed in the bleached state. The bargraphs of FIG. 1 show the values 1.4, 2.0 and 0.8, respectively.

Figure 2:
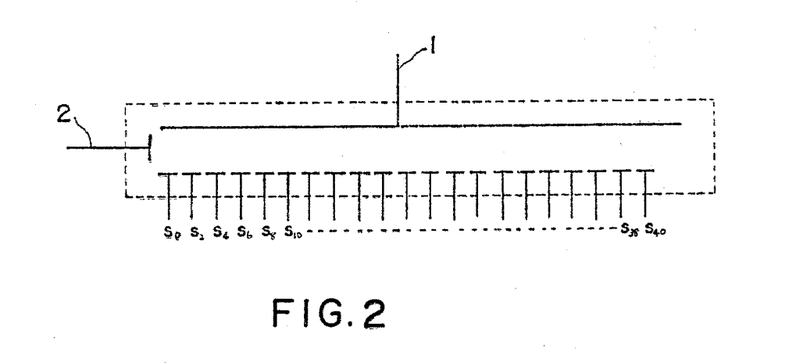
FIG. 2 is a schematic sectional view of an embodiment of an electrochromic display cell of the present invention.

FIG. 2 schematically shows an electrochromic display cell for achieving the bargraph display of FIG. 1.

The electrochromic display cell of FIG. 2 comprises a counter electrode 1, a reference electrode 2, and segment electrodes $S_0$ through $S_{40}$. The reference electrode 2 is required for the constant potential type drive and, therefore, the reference electrode 2 can be omitted in case where other drive systems are employed, such as the constant voltage type drive and the constant current type drive.

Figure 3:
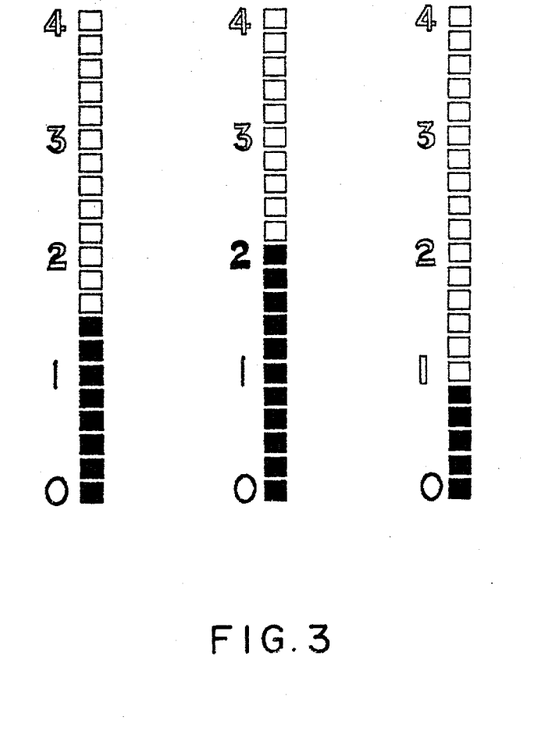
FIG. 3 is a schematic view of another example of a bargraph display conducted by another embodiment of an electrochromic display device of the present invention.

FIG. 3 schematically shows another example of a bargraph display conducted by another embodiment of an electrochromic display device of the present invention, wherein indication numerals are also incorporated in the electrochromic display device. The indication numeral 1 is colored only when the displayed value is greater than or equal to "1". Similarly, the indication numeral 2 is colored only when the displayed value is greater than or equal to "2".

Figure 4:
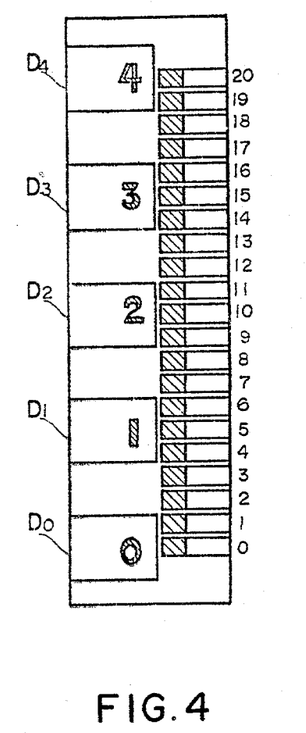
FIG. 4 is a plan view of an example of a segment electrode pattern employed in the electrochromic display device of FIG. 3.

FIG. 4 shows an example of a segment electrode pattern employed in the electrochromic display device of FIG. 3.

In FIG. 4, hatched portions represent segment electrodes on which electrochromic material is coated. The bargraph segments are connected to transparent lead electrodes 0 through 20, respectively. The numeral segments are connected to transparent lead electrodes $D_0$ through $D_4$, respectively. The lead electrode $D_0$ is connected to receive the same signal as applied to the lead electrode 0. The lead electrode $D_1$ is connected to receive the same signal as applied to the lead electrode 5. Similarly, the lead electrodes $D_2$, $D_3$ and $D_4$ are connected to receive the same signals as applied to the lead electrodes 10, 15 and 20, respectively.

Figure 5:
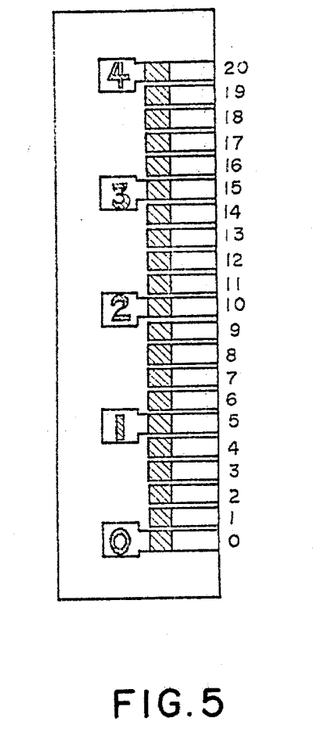
FIG. 5 is a plan view of another example of a segment electrode pattern employed in the electrochromic display device of FIG. 3.

FIG. 5 shows another example of a segment electrode pattern employed in the electrochromic display device of FIG. 3. The lead electrode for the numeral segment 0 is common to the bargraph segment lead electrode 0. The lead electrode for the numeral segment 1 is common to the bargraph segment lead electrode 5. Similarly, the lead electrodes for the numeral segments 2, 3 and 4 are common to the bargraph segment lead electrodes 10, 15 and 20, respectively.

Figure 6:
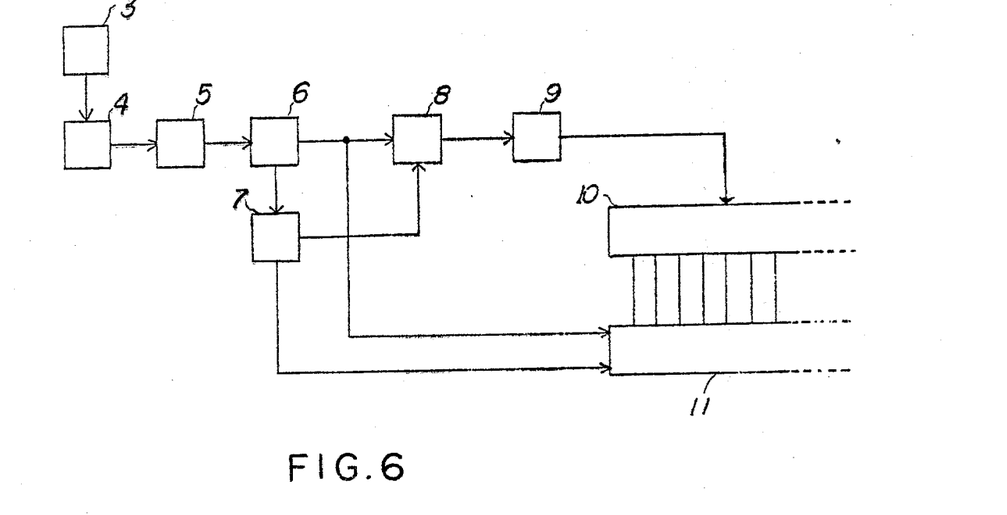
FIG. 6 is a block diagram of an embodiment of a driver circuit of the present invention.

FIG. 6 is a block diagram of an embodiment of a driver circuit of the present invention.

The driver circuit of FIG. 6 mainly comprises a transducer 3 for developing an electric signal corresponding to a detected analog value such as a temperature and a wheel velocity, and a V-F converter 4 for converting the electric signal to a signal having a frequency representing the detected analog value. An output signal of the V-F converter 4 is applied to a counter 5 of which contents are sampled by a register 6 and stored therein. The contents stored in the register 6 are applied to another register 7 so that the register 7 stores the information which was stored in the register 6 at the preceding timing.

The driver circuit of FIG. 6 further comprises a comparator 8 for comparing the contents stored in the registers 6 and 7. Accordingly, the comparator 8 detects whether the detected analog value is increasing or decreasing. An output circuit 9 is controlled by the comparator 8 for developing the coloration signal or the bleaching signal to an electrochromic display cell 10. Segment selection switches 11 are connected to the respective segment electrodes included within the electrochromic display cell 10 for selectively applying the coloration signal and the bleaching signal only to the segment electrodes of which display states shoud be changed.

Figure 7:
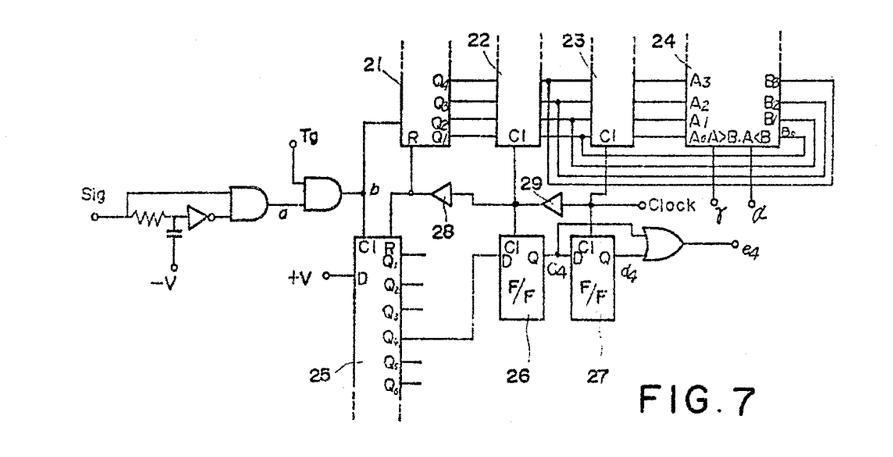
FIG. 7 is a detailed block diagram of a portion of the driver circuit of FIG. 6.

FIG. 7 is a detailed block diagram of the counter 5, the registers 6 and 7, and the comparator 8.

An output signal Sig of the V-F converter 4 has a frequency proportional to the detected analog value. An output signal a of an AND gate is a differentiated pulse of the leading edge of the signal Sig and, therefore, the signal a has a frequency identical with that of the signal Sig. A gate pulse $T_g$ has a leading edge which appears at the trailing edge of a data sampling pulse Clock. The gate pulse $T_g$ has a predetermined pulsewidth, which determines the proportional constant between the frequency of the signal Sig and the colored segments in the bargraph display. A signal b is a logic product of the differentiated output a and the gate pulse $T_g$.

The thus obtained signal b is applied to a multi-stage binary counter 21 as an input pulse, and to a shift register 25 as a clock pulse. Counter outputs are stored in registers 22 and 23. The register 23 stores the contents stored in the register 22 at the preceding step. A magnitude comparator 24 compares the contents stored in the registers 22 and 23. That is, the comparator 24 detects whether the analog value to be displayed is increasing or decreasing. When the contents stored in the register 23 are greater than that stored in the register 22, that is, when the analog value is decreasing, an output $\gamma$ of the comparator 24 bears the logic "High". When the contents stored in the register 22 are greater than that stored in the register 23, that is, when the analog value is increasing, an output $\alpha$ of the comparator 24 bears the logic "High". In case where the contents stored in the registers 22 and 23 are identical with each other, the outputs $\alpha$ and $\gamma$ bear the logic "Low".

The data input D of the shift register 25 is connected to a voltage source +V and, therefore, the data input D is maintained at the logic "High". Another voltage source −V corresponds to the logic "Low". Accordingly, the "High" level is shifted in the shift register 25 in response to the clock pulse b. In case where the signal b takes the "High" level four times after the generation of the data sampling pulse Clock, which is applied to the reset terminal of the shift register 25, outputs $Q_1$ through $Q_4$ of the shift register 25 take the logic "High".

A D-type flip-flop 26 is connected to receive the output $Q_4$ of the shift register 25, and another D-type flip-flop 27 is connected to receive the output signal of the D-type flip-flop 26. The flip-flop 27 stores the output $Q_4$ of the preceding step. The flip-flops 26 and 27 and an exclusive-OR gate, in combination, detect the variation of the output $Q_4$. The thus formed display state change detection circuit comprising the flip-flops 26 and 27 and the exclusive-OR gate is provided for each of the outputs of the shift register 25. In FIG. 7, only one combination of the flip-flops 26 and 27 and the exclusive-OR gate is illustrated for the purpose of simplicity. An output $e_4$ of the exclusive-OR gate takes the logic "High" only when the output $Q_4$ changes its logic.

The data sampling pulse Clock determines a timing at which the output data of the multi-stage binary counter 21 are introduced into the register 22, and the output data of the shift register 25 are introduced into the flip-flop 26. In addition, in response to the date sampling pulse Clock, the date stored in the registers 22 and 23 are compared by the comparator 24, and the data stored in the flip-flops 26 and 27 are compared by the exclusive-OR gate. More specifically, the data sampling pulse Clock functions as a clock pulse for the registers 22 and 23 and the flip-flops 26 and 27. Moreover, the data sampling pulse Clock functions as a reset pulse for the binary counter 21 and the shift register 25. Buffers 28 and 29 are provided for shifting the timing, thereby preventing the erasure of the data. It will be clear that the shift register 25 has the output terminals by the number corresponding to the number of the bargraph segments.

Figure 8:
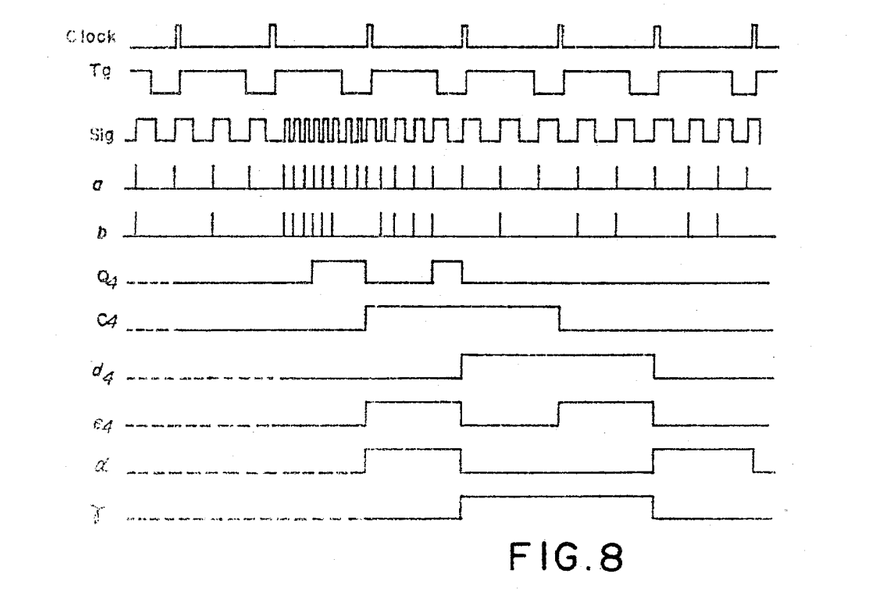
FIG. 8 is a time chart showing various signals occurring within the driver circuit of FIG. 7.

Operation of the circuit of FIG. 7 will be described with reference to FIG. 8.

Main purposes of the circuit of FIG. 7 are to color the bargraph segments by the number corresponding to the frequency of the obtained signal Sig, and to detect whether the analog value is decreasing or increasing.

The clock pulse b has pulses by a number proportional to the frequency of the signal Sig within one cycle. The clock pulse b is applied to the shift register 25 to set the outputs of the shift register 25 to the logic "High" by the number corresponding to the number of the clock pulse b, and to the binary counter 21 which counts the number of the clock pulse b. The parallel output of the shift register 25 determine the coloration of the each bargraph segment. The change of the number of the clock pulse b is detected by the comparator 24. And, the change of the coloration state of the each bargraph segment is detected by the exclusive-OR gate.

Now assume that the pulse number of the clock pulse b is changed from one (1) to six (6). The output $\alpha$ of the comparator 24 bears the logic "High" to develop the coloration control signal. Each exclusive-OR gate develops an output signal indicating which bargraph segments should be colored. More specifically, as to the output $Q_4$, the output $Q_4$ bears the logic "High" in case where the clock pulse b has pulses more than or equal to four (4). Accordingly, when the pulse number of the clock pulse b is changed from one (1) to six (6), the output $e_4$ takes the logic "High".

Contrarily, when the pulse number of the clock pulse b is changed from four (4) to one (1), the output $\gamma$ of the comparator 24 takes the logic "High", whereby the bleaching control signal is developed. At this moment, the output $e_4$ takes the logic "High", whereby the bargraph segment corresponding to the output $e_4$ is driven to receive the bleaching signal.

Figure 9:
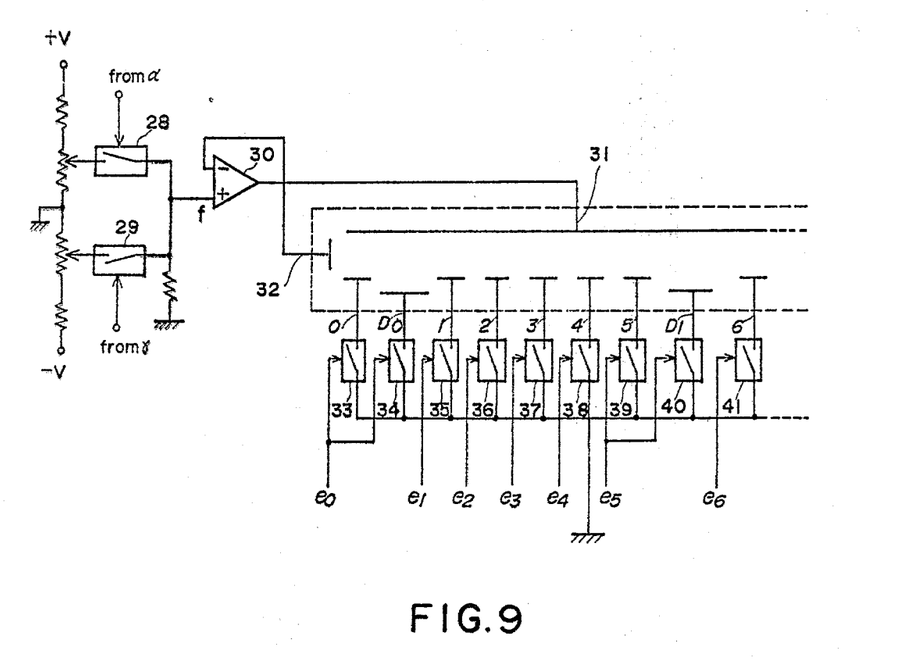
FIG. 9 is a circuit diagram of an embodiment of an output circuit for driving the electrochromic display device of the present invention.

The output signals $\alpha$, $\gamma$ and $e_4$ are applied to the output circuit 9. FIG. 9 shows an embodiment of the output circuit of the constant potential type.

The output circuit of FIG. 9 mainly comprises analog switches 28 and 29 controlled by the output signals $\alpha$ and $\gamma$, respectively, and an operation amplifier 30. The operation amplifier 30 is connected to a counter electrode 31 and a reference electrode 32 of the electrochromic display cell. Segment selection analog switches 33 through 41 are disposed between the segment electrodes and the grounded terminal. The analog switches 28, 29 and 33 through 41 are ON when the output signals $\alpha$, $\gamma$ and $e_0$ through $e_6$ take the logic "High", respectively. The electrochromic display cell of FIG. 9 corresponds to the cell of the embodiment of FIG. 4.

Figure 10:
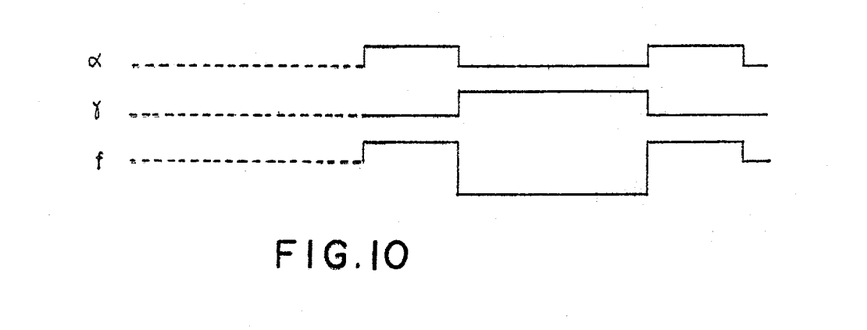
FIG. 10 is a time chart showing various signals occurring within the output circuit of FIG. 9.

Operation of the output circuit of FIG. 9 will be described with reference to FIG. 10.

When the output signal $\alpha$ bears the logic "High", the analog switch 28 is turned on, and the coloration control signal appears at a terminal f. At this moment if the output $e_4$ bears the logic "High", the bargraph segment 4 is colored. Contrarily, when the output signal $\gamma$ bears the logic "High", the analog switch 29 is turned on, and the bleaching control signal appears at the terminal f. At this moment if the output signals $e_3$ and $e_4$ take the logic "High", the bargraph segments 3 and 4 are bleached.

Figure 11:
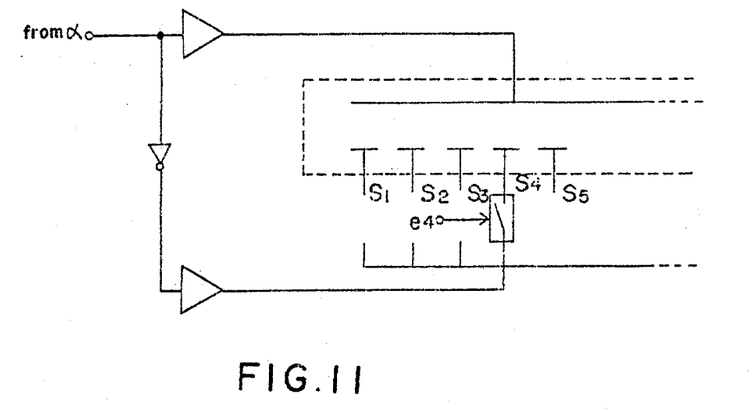
FIG. 11 is a circuit diagram of another embodiment of an output circuit for driving the electrochromic display device of the present invention.

FIG. 11 shows another embodiment of the output circuit. The output circuit of FIG. 11 functions in the constant voltage mode.

Figure 12:
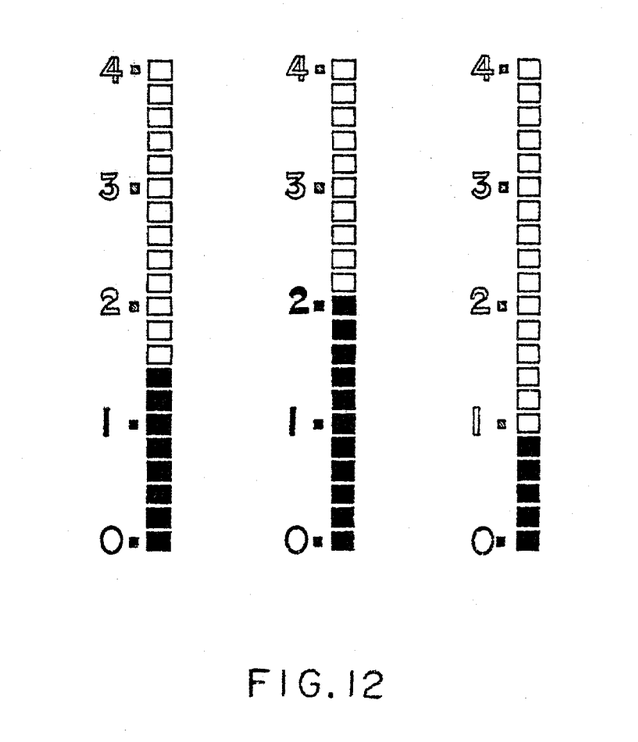
FIG. 12 is a schematic view of still another example of a bargraph display conducted by still another embodiment of an electrochromic display device of the present invention.
Figure 13:
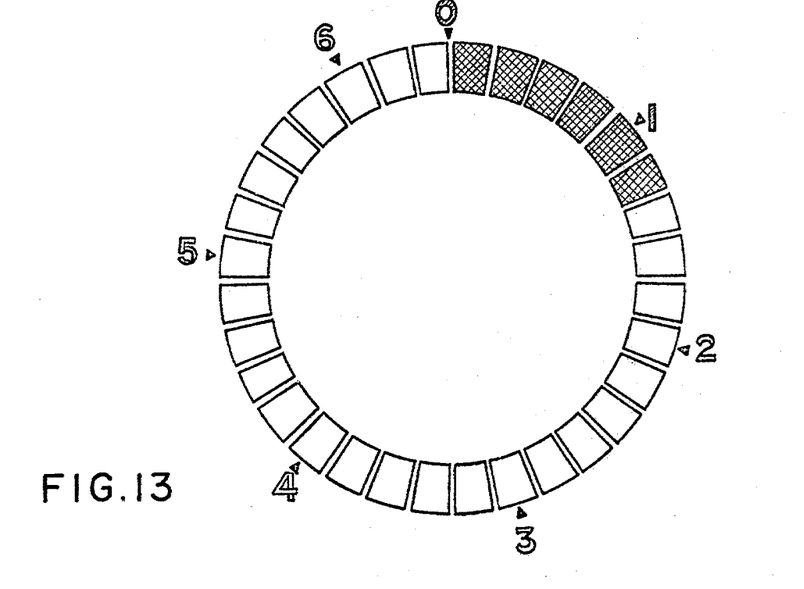
FIG. 13 is a schematic view of yet another example of a bargraph display conducted by yet another embodiment of an electrochromic display device of the present invention.

FIGS. 12 and 13 show other examples of the bargraph display performed by the present invention.

Figure 14:
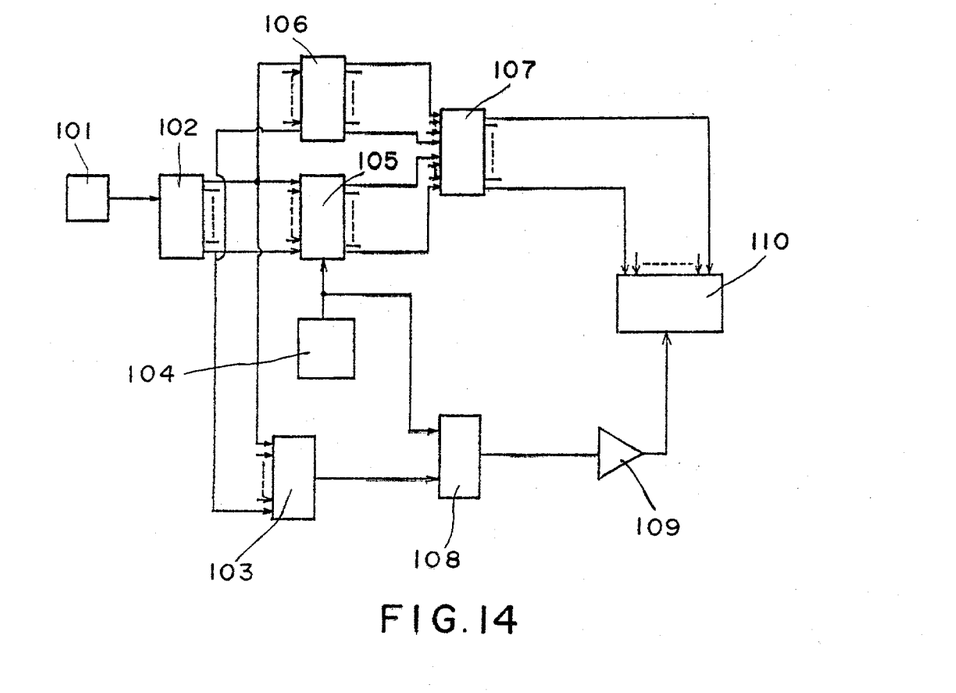
FIG. 14 is a block diagram of another embodiment of a driver circuit of the present invention.

FIG. 14 is a block diagram of another embodiment of a driver circuit of the present invention, which can regenerate the display condition of the electrochromic display device.

The driver circuit of FIG. 14 comprises a detector 101 for developing an electric signal of which voltage or current corresponds to the detected analog value, and a segment signal generator 102 for developing the bargraph segment drive signal in accordance with the electric signal derived from the detector 101. The bargraph segment drive signal indicates whether the corresponding bargraph segments should be placed in the coloration state or the bleached state.

The bargraph segment drive signal is applied to a display value change detection circuit 103 for developing a coloration control signal to an applying voltage polarity selection circuit 108 when the number of segments to be placed in the coloration state is increased, and for developing a bleaching control signal to the applying voltage polarity selection circuit 108 when the number of segments to be placed in the coloration state is decreased. The bargraph segment drive signal is also applied to a segment state change detection circuit 106, which is provided for effectively utilizing the memory characteristics of the electrochromic display device.

The driver circuit of FIG. 14 further comprises a regeneration pulse generator 104 for conducting the regeneration of the displayed information in a predetermined interval, for example, several seconds to several hours. The output command of the regeneration pulse generator 104 is applied to a regeneration discriminator 105, which develops a control signal for conducting the coloration regeneration operation to the segments which are placed in the coloration state and the bleach regeneration operation to the segments which are placed in the bleached state. Segment selection switches 107 are controlled by output signals of the regeneration discriminator 105 and the segment state change detection circuit 106. Segments included in an electrochromic display cell 110 are placed in the memory state when the corresponding segment selection switches 107 are OFF. An output circuit 109 is connected to receive an output signal of the applying voltage polarity selection circuit 108 for applying a voltage signal of a polarity selected by the applying voltage polarity selection circuit 108 to the electrochromic display cell 110. Detailed constructions of the segment signal generator 102, the display value change detection circuit 103, the regeneration discriminator 105 and the segment state change detection circuit 106 are shown FIG. 15. FIG.

Figure 15:
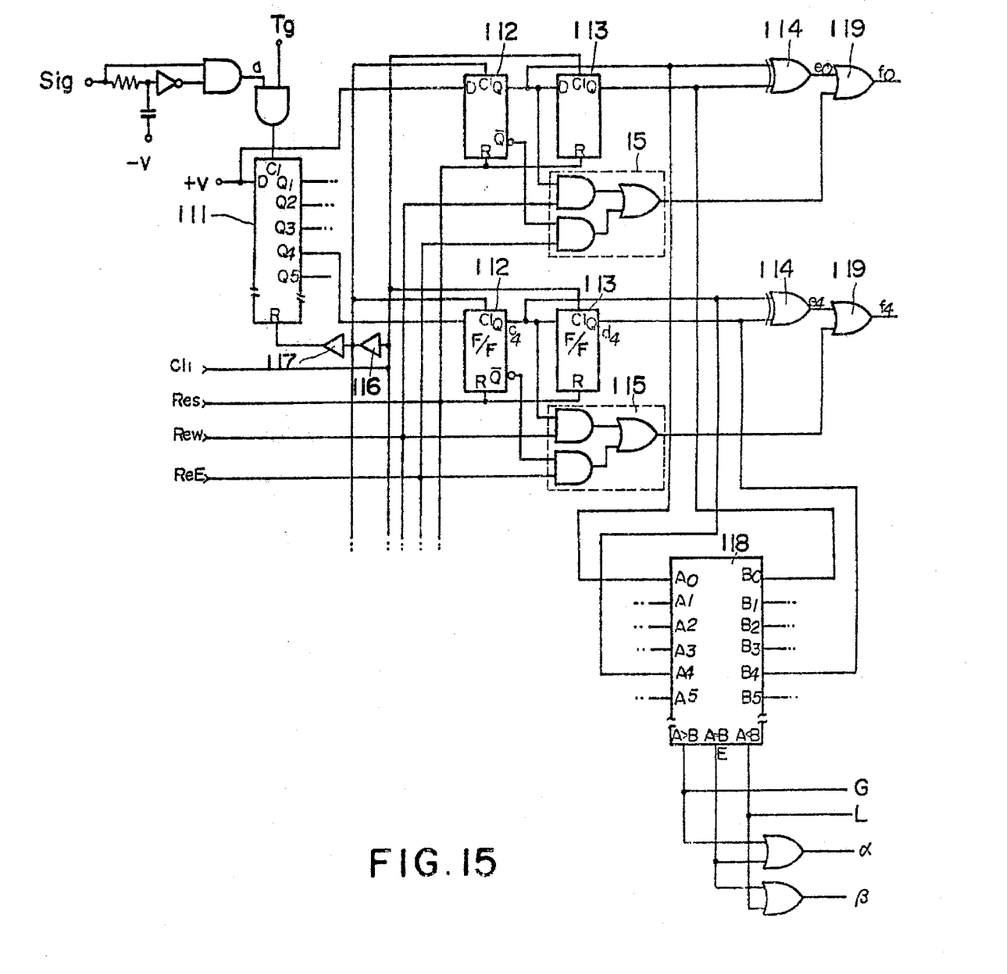
FIG. 15 is a detailed block diagram of a portion of the driver circuit of FIG. 14.
Figure 16:
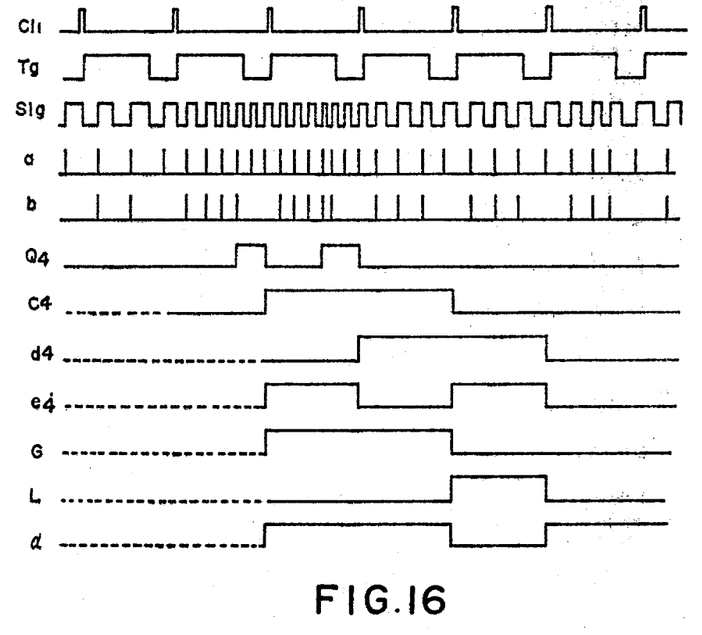
FIG. 16 is a time chart showing various signals occurring within the driver circuit of FIG. 15.

16 shows various signals occurring within the circuit of FIG. 15.

A signal Sig has a frequency proportional to the value of the electric signal derived from the detector 101. A signal a is a differentiated signal of the leading edge of the signal Sig. A logic product of the signal a and a gate signal $T_g$ is applied to a serial input/parallel output shift register 111 as a clock signal. The data input of the shift register 111 is connected to a terminal $+V$ of the logic value "High". Accordingly, parallel outputs $Q_1, \ldots$ of the shift register 111 take the logic "High" by the number corresponding to the number of the clock signal. That is, the parallel outputs $Q_1 \ldots$ take the logic "High" by the number proportional to the frequency of the signal Sig and the pulsewidth of the gate signal $T_g$.

The circuit of FIG. 15 comprises D-type flip-flops 112 and 113, and exclusive-OR gates 114. The D-type flip-flops 112 and 113 are provided for each of the outputs of the shift register 111. Respective Q outputs of the flip-flops 112 and 113 are applied to the exclusive-OR gate 114. The flip-flops 112 and 113 are controlled by a data sampling pulse $Cl_1$, which is applied to the flip-flops 112 via a buffer 116. The buffer 116 functions to delay the clock pulse. A reset terminal of the shift register 111 is connected to receive the data sampling pulse $Cl_1$ via the buffer 116 and another buffer 117, which further delays the clock pulse. Accordingly, the Q output of the flip-flop 112 corresponds to the parallel outputs of the shift register 111 at a time immediately before the reset operation is conducted, whereas the Q output of the flip-flop 113 corresponds to the parallel outputs of the shift register 111 at a time immediately before the reset operation of the preceding step was conducted. An output signal of the exclusive-OR gate 114 bears the logic "High" only when the contents stored in the flip-flop 112 are changed.

A regeneration discriminator 115 functions to transfer a coloration regeneration pulse ReW to an OR gate 119 when the Q output of the flip-flop 112 bears the logic "High", namely, when the corresponding segment is placed in the coloration state, and to transfer a bleach regeneration pulse ReE to the OR gate 119 when the Q output of the flip-flop 112 bears the logic "Low", namely, when the corresponding segment is placed in the bleached state. Output signals $f_0$ through $f_4, \ldots$ of the OR gates 119 control segment switches $SW_0$ through $SW_4, \ldots$ as shown in FIG. 20.

The circuit of FIG. 15 further comprises a magnitude comparator 118, which compares the contents stored in the flip-flops 112 and 113. When the analog value to be displayed increases, a signal G indicating $A > B$ bears the logic "High". Contrarily, when the analog value to be displayed decreases, a signal L indicating $A < B$ bears the logic "High". When the analog value to be displayed does not change, a signal E indicating $A = B$ bears the logic "High". The signals G and L are used to determine the polarity of the voltage to be applied to the electrochromic display cell. In case where the signal G takes the logic "High", the coloration operation is conducted, whereas the bleaching operation is conducted when the signal L takes the logic "High". Signals $\alpha$ and $\beta$ control the timing of the generation of the regeneration pulse. The flip-flops 112 and 113 are reset by a reset pulse Res.

Figure 20:
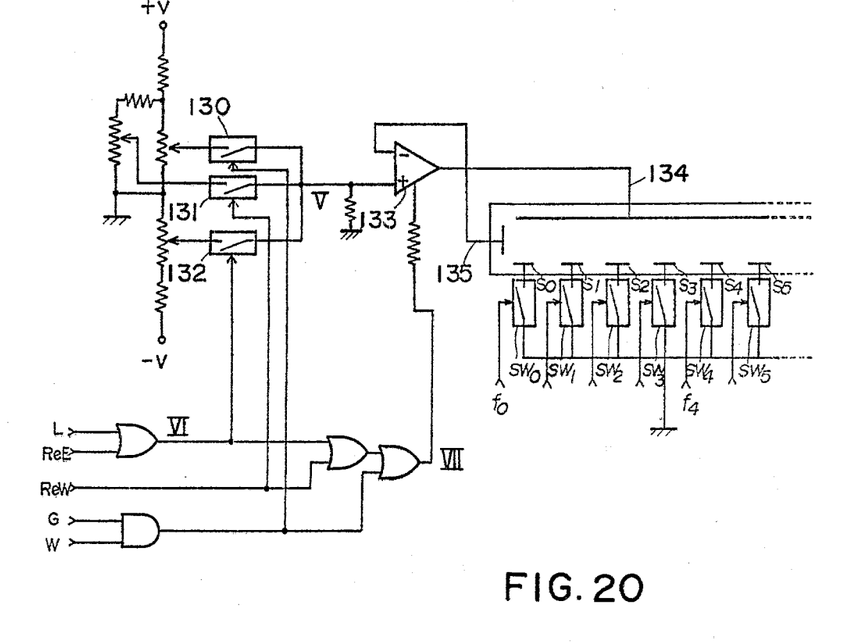
FIG. 20 is a circuit diagram of an embodiment of an output circuit associated with the driver circuit of FIG. 15.

The output signal $f_0$ controls the segment switch $SW_0$ connected to a segment $S_0$ shown in FIG. 20. The output signal $f_0$ always takes the logic "High" to always place the segment $S_0$ in the coloration state, because the data input of the flip-flop 112 is connected to the terminal $+V$.

In FIG. 15, only the control circuit associated with the parallel output $Q_4$ is illustrated for the purpose of simplicity.

Figure 17:
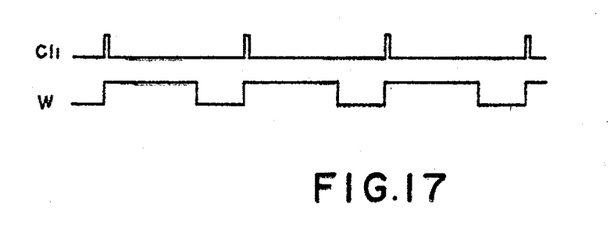
FIG. 17 is a time chart showing relationship between a data sampling pulse $Cl_1$ and a coloration pulse W.

Generally, it is preferable that the bleaching operation period is longer than the coloration operation period to obtain a uniform color display. To this end, in the embodiment of FIGS. 14 and 15, a coloration pulse W has a pulsewidth shorter than one data sampling pulse period as shown in FIG. 17. The above-mentioned regeneration operation is conducted at a period $\overline{W}$, at which the coloration pulse W bears the logic "Low". Accordingly, the normal coloration operation is not influenced by the regeneration operation.

Figure 18:
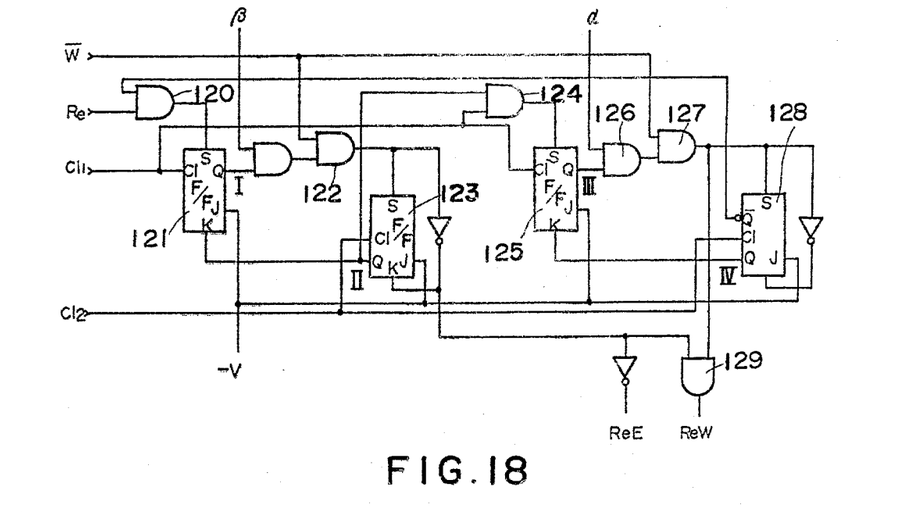
FIG. 18 is a block diagram of an embodiment of a coloration/erase regeneration pulse generator associated with the driver circuit of FIG. 15.
Figure 19:
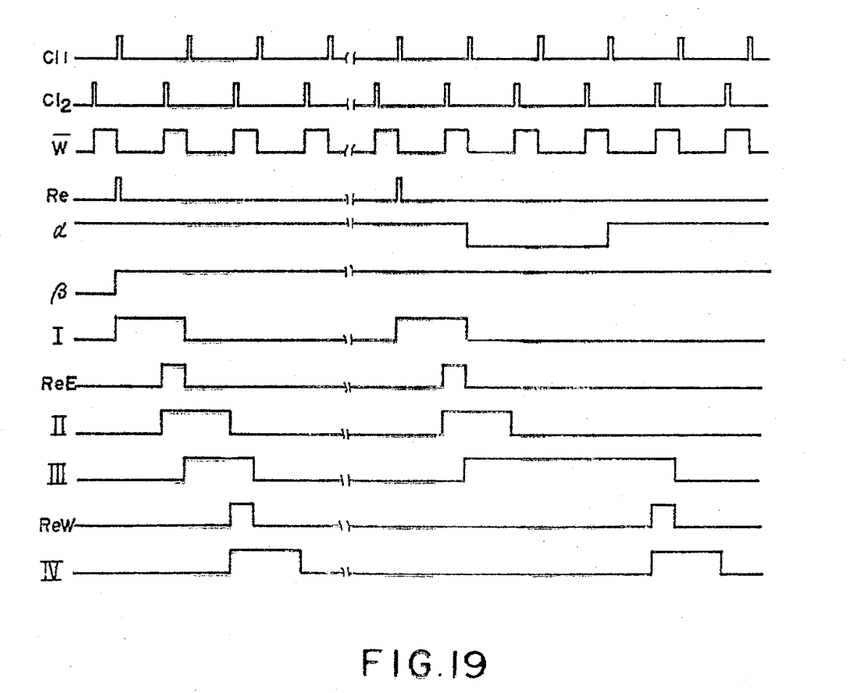
FIG. 19 is a time chart showing various signals occurring within the generator of FIG. 18.

FIG. 18 is a block diagram of a logic circuit for developing the coloration regeneration pulse ReW and the bleach regeneration pulse ReE. FIG. 19 is a time chart showing various signals occurring within the logic circuit of FIG. 18.

The pulse $\overline{W}$ determines the regeneration operation period. A regeneration trigger pulse Re bears the logic "High" at a time when the data sampling pulse $Cl_1$ bears the high level. The regeneration trigger pulse Re has a predetermined period, for example, several seconds to several hours. The data sampling pulse $Cl_1$ is a differentiated pulse of the leading edge of the coloration pulse W. A pulse $Cl_2$ is a differentiated pulse of the trailing edge of the coloration pulse W. The bleach regeneration pulse ReE and the coloration regeneration pulse ReW are formed through the use of the above-mentioned pulses $\overline{W}$, Re, $Cl_1$ and $Cl_2$.

The logic circuit of FIG. 18 comprises J-K flip-slops 121, 123, 125 and 128, and AND gates 120, 122, 124, 126, 127 and 129. The signals $\alpha$ and $\beta$ are the coloration regeneration enable signal and the bleach regeneration enable signal, respectively, derived from the comparator 118 of FIG. 15. The J terminals of the entire J-K flip-flops 121, 123, 125 and 128 are commonly connected to a terminal $-V$ of the logic "Low".

When the regeneration trigger pulse Re bears the logic "High", the flip-flop 121 is turned to set and, hence, the Q output of the flip-flop 121 bears the logic "High" in case where the $\overline{Q}$ output of the flip-flop 128 bears the logic "High". The pulse $\overline{W}$ is transferred through the AND gate 122 as long as the signal $\beta$ takes the logic "High" and, therefore, the bleach regeneration pulse ReE is developed through two inverters. At the same time, the pulse $\overline{W}$ functions to set the flip-flop 123 and, hence, the K terminal of the flip-flop 121 bears the logic "High". Therefore, the flip-flop 121 is reset at a time when the following clock pulse $Cl_1$ takes the logic "High". Accordingly, the bleach regeneration pulse ReE appears during only one pulsewidth of the pulse $\overline{W}$.

Under the condition where the flip-flop 123 is set, when the following clock pulse $Cl_1$ bears the logic "High", the flip-flop 125 is turned to set. The flip-flop 123 is reset by the following clock pulse $Cl_2$ which appears after the bleach regeneration pulse ReE becomes the logic "Low". Accordingly, the flip-flops 121 and 123 are returned to the initial reset states. In case where the signal $\beta$ takes the logic "Low", the bleach regeneration pulse ReE takes the logic "Low". The bleach regeneration pulse ReE takes the logic "High" only when the signal $\beta$ takes the logic "High".

Now assume that the flip-flop 125 is set and the signal $\alpha$ bears the logic "High". In the same way as discussed above, the coloration regeneration pulse ReW is developed for one pulsewidth of the pulse $\overline{W}$ and, thereafter, the flip-flops 125 and 128 are reset to return the initial conditions.

However, even when the flip-flop 125 is set, the coloration regeneration pulse ReW will not appear as long as the signal α bears the logic "Low". This is because the pulse $\overline{W}$ does not pass through the AND gate 127 when the signal α bears the logic "Low". The flip-flop 128 is remained to reset, and the flip-flop 125 will not be reset. When the signal α changes to the logic "High", the following operation is conducted. The coloration regeneration pulse ReW is developed for one pulsewidth period of the pulse $\overline{W}$, and the flip-flops 125 and 128 are turned to reset to return to the initial conditions. In this way, the regeneration operation is completed.

Figure 21:
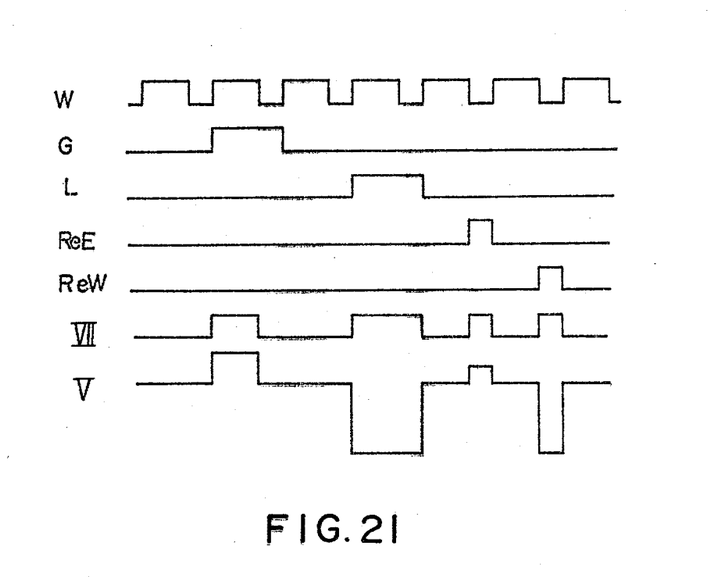
FIG. 21 is a time chart showing various signals occurring within the output circuit of FIG. 20.

FIG. 20 shows an embodiment of the segment selection switches 107, the applying voltage polarity selection circuit 108, and the output circuit 109. FIG. 21 is a time chart showing various signals occurring within the circuit of FIG. 20.

A positive voltage terminal $+V$ and a negative voltage terminal $-V$ are provided. The circuit of FIG. 20 mainly comprises analog switches 130, 131 and 132 each of which functions to introduce the coloration voltage, the coloration regeneration voltage, and the bleach/bleach regeneration voltage to a positive input of a programmable operation amplifier 133. The programmable operation amplifier 133 is connected to a counter electrode 134 and a reference electrode 135 of the electrochromic display cell.

Segment selection analog switches $SW_0$ through $SW_5$... are connected to bargraph segments $S_0$ through $S_5$,.... When a signal VII bears the logic "High", the operation amplifier 133 performs the linear operation. Contrarily, when the signal VII bears the logic "Low", the entire terminals of the operation amplifier 133 show the high impedance. The coloration operation is conducted for a period of time determined by the pulsewidth pf the pulse W, and the bleaching operation is conducted for a period of time determined by the period of the pulse W.

The circuit of FIG. 20 operates in the constant potential mode. The bargraph segments which are continuously placed in the coloration state for a long period of time are regenerated by the coloration regeneration pulse ReW to ensure the uniform coloration.

Figure 22:
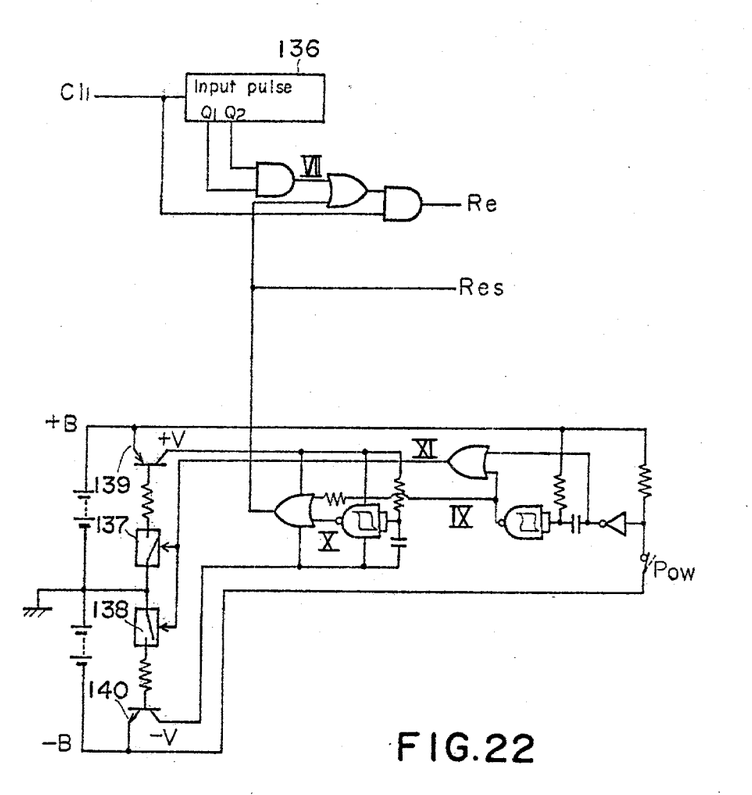
FIG. 22 is a circuit diagram of an embodiment of a regeneration trigger signal generator associated with the driver circuit of FIG. 15.
Figure 23:
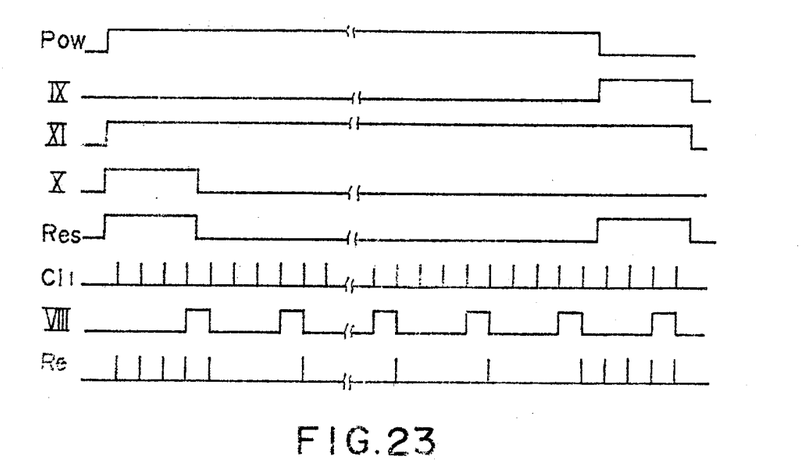
FIG. 23 is a time chart showing various signals occurring within the trigger signal generator of FIG. 22.

FIG. 22 shows an embodiment of a circuit for developing the regeneration trigger signal Re. FIG. 23 shows various signals occuring within the circuit of FIG. 22.

The circuit of FIG. 22 mainly comprises a ripple counter 136 of which outputs $Q_1$ and $Q_2$ alternatingly change in response to the trailing edge of an input signal $Cl_1$. The circuit of FIG. 22 functions to develop the regeneration trigger pulse Re. Res is a reset pulse. Power source voltages $+B$ and $-B$ are applied to transistor switches 139 and 140 to develop driving voltages $+V$ and $-V$.

The circuit of FIG. 22 further comprises a power supply switch Pow. In FIG. 23, the power supply switch Pow is ON when the waveform bears the high level. A one-shot pulse IX is developed from a NAND/Schmitt trigger gate, the one-shot pulse IX bearing the logic "High" when the power supply switch Pow is switched off. Another one-shot pulse X takes the logic "High" when the power supply switch Pow is switched on. The base currents of the transistor switches 139 and 140 are controlled on-off by analog switches 137 and 138, respectively. The analog switches 137 and 138 are controlled by a signal XI.

When the power supply switch Pow is switches on, the transistor switches 139 and 140 are turned on. The reset pulse Res bears the logic "High" for a period of time longer than that of the clock pulse $Cl_1$. Accordingly, the flip-flops 112 and 113 of FIG. 15 are reset. At this moment, the regeneration trigger signal Re is developed to conduct the bleach regeneration operation to the entire bargraph segments.

In the normal mode, the regeneration trigger signal Re is developed every fourth pulse of the clock pulse $Cl_1$. The period of the regeneration trigger signal Re can be extended by increasing the step number of the ripple counter 136.

When the power supply switch Pow is switched off, the signal IX bears the logic "High" and, therefore, the driving voltages $+V$ and $-V$ are continuously supplied to the circut elements. At this moment, the reset pulse Res bears the logic "High" to apply the bleach regeneration pulse to the entire bargraph segments as in the case when the power supply switch Pow is switched on.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A driver circuit for a bargraph electrochromic display device including a plurality of aligned segments for displaying an analog value comprising:
    analog value generating means for generating said analog value for each of said plurality of aligned segments;
    first detection means for detecting whether the analog value for each of said plurality of segments increases or decreases and developing first and second control signals, respectively, in response to said increases and decreases; and
    coloration/bleaching signal generator means responsive to said first and second control signals for developing a coloration drive signal in response to said first control signal and a bleaching drive signal in response to said second control signal.

2. The driver circuit of claim 1, wherein said coloration drive signal from said coloration/bleaching signal generator means colors at least one of said plurality of aligned segments, and said bleaching drive signal from said coloration/bleaching signal generator means bleaches at least one of said plurality of aligned segments.

3. The driver circuit of claim 1, wherein said first detection means comprises:
    first register means for storing a first analog value representing said analog value produced by said analog value generating means at a first point in time;
    second register means for storing a second analog value representing said analog value produced by said analog value generating means at a second point in time greater than said first point in time;
    comparator means responsive to an output signal from said first register means indicative of said first analog value and to an output signal from said second register means indicative of said second analog value for comparing said first analog value with said second analog value, said comparator means generating said first control signal when said second analog value is greater than said first analog value, said comparator means generating said second control signal when said second analog value is less than said first analog value.

4. The driver circuit of claim 1, wherein said second detection means comprises:
first flip-flop means provided for each segment of the bargraph electrochromic display device for storing information relating to a present displway state of each of said plurality of aligned segments;
second flip-flop means provided for each segment of the bargraph electrochromic display device for storing information relating to a preceding display state of each of said plurality of aligned segments; and
segment selection signal generator means provided for each segment of the bargraph electrochromic display device for developing a segment selection signal when the contents of said first flip-flop means for each segment is not equal to the contents of said second flip-flop means for each segment, said segment selection signal including,
said first additional control signal generated by said segment selection signal generator means when the contents of said first flip-flop means is greater than the contents of said second flip-flop means, and
said second additional control signal generated by said segment selection signal generator means when the contents of said first flip-flop means is less than the contents of said second flip-flop means.

5. The driver circuit of claim 4, wherein said first and second flip-flop means comprise D-type flip-flop means, and wherein the D-type second flip-flop means are connected to receive the $Q$ output signals of the corresponding D-type first flip-flop means.

6. The driver circuit of claim 4, further comprising segment selection switches connected to each of said aligned segments, said segment selection switches closing to an on position in response to energization by said segment selection signals.

7. The driver circuit of claim 1, wherein said bleaching drive signal has a longer period then said coloration drive signal.

8. The driver circuit of claim 7, further comprising:
regeneration pulse generator means for regenerating the display states of said first group and said second group of aligned segments; and
control means for constraining the activation of said regeneration pulse generator means in controlling the regeneration of the display states of said first group and said second group of aligned segments, said control means constraining the activation of said regeneration pulse generator means when said coloration drive signal is developed by said coloration/bleaching signal generator means.

9. The driver circuit of claims 1, 2, or 3 further comprising:
second detection means for detecting whether the analog value for each of said plurality of aligned segments increases or decreases thereby developing a first additional control signal when said analog value increases and a second additional control signal when said analog value decreases; and
switching means connected to each of said aligned segments and responsive to said first additional control signal and said second additional control signal for applying said coloration drive signal to a first group of said aligned segments when said switching means associated with said first group of aligned segments are energized by said first additional control signal, said switching means applying said bleaching drive signal to a second group of said aligned segments when said switching means associated with said second group of aligned segments are energized by said second additional control signal, said switching means connected to a third group of aligned segments maintaining said third group of aligned segments in an unenergized state when said analog value associated with said third group of aligned segments neither increases nor decreases.

10. An electrochromic display device for displaying an analog value, comprising,
counter electrode means,
a plurality of segment electrode means, and
an electrochromic substance interposed between said couner electrode means and said plurality of segment electrode means;
wherein said plurality of segment electrode means comprises a bargraph display means, each of the segments of said segment electrode means corresponding to a particular bar of said bargraph display means; and
wherein said bargraph display means of said electrochromic display device further includes a plurality of additional segment electrode means connected to predetermined ones of said plurality of segment electrode means, each of said additional segment electrode means being shaped in the form of a numeral, each of the numeral shaped additional segment electrode means being colored when each of said predetermined ones of said plurality of segment electrode means is colored.

11. The electrochromic display device of claim 10 wherein each of said numeral shaped additional segment electrode means is integrally formed with its corresponding segment electrode means to form a unitary structure.

12. The electrochromic display device of claim 10 wherein each of said numeral shaped additional segment electrode means is separately formed relative to its corresponding segment electrode means thereby forming two separate displays, each of said two separate displays being connected together via a lead.

13. The electrochromic display device of claim 12, wherein said plurality of segment electrode means are arranged in a circular manner to form a circular bargraph display means, said numeral shaped additional segment electrode means being connected to said predetermined ones of said plurality of segment electrode means.

* * * * *